(12) United States Patent
Mehta et al.

(10) Patent No.: US 7,683,716 B2
(45) Date of Patent: Mar. 23, 2010

(54) CONSTANT OUTPUT COMMON MODE VOLTAGE OF A PRE-AMPLIFIER CIRCUIT

(75) Inventors: Ravi Jitendra Mehta, Bangalore (IN); Sumantra Seth, Bangalore (IN); Sujoy Chinmoy Chakravarty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 12/174,619

(22) Filed: Jul. 16, 2008

(65) Prior Publication Data

US 2009/0302895 A1   Dec. 10, 2009

(51) Int. Cl.
   *H03F 3/45* (2006.01)
(52) U.S. Cl. .................. 330/258; 330/257; 330/255
(58) Field of Classification Search .......... 330/258, 330/257, 255
   See application file for complete search history.

(56) References Cited

U.S. PATENT DOCUMENTS

| | | | | |
|---|---|---|---|---|
| 4,272,728 A | * | 6/1981 | Wittlinger | 330/253 |
| 5,550,510 A | * | 8/1996 | Nagaraj | 330/253 |
| 6,531,919 B1 | * | 3/2003 | Carter | 330/252 |
| 6,636,111 B1 | * | 10/2003 | Gross et al. | 327/589 |
| 2006/0119429 A1 | * | 6/2006 | Lim | 330/253 |

* cited by examiner

*Primary Examiner*—Patricia Nguyen
(74) *Attorney, Agent, or Firm*—Ronald O. Neerings; Wade James Brady, III; Frederick J. Telecky, Jr.

(57) ABSTRACT

A method, apparatus and system of constant output common mode voltage of a pre-amplifier circuit are disclosed. In one embodiment, a system includes a first circuit, a comparator circuit coupled with an output of the first circuit, a pre-amplifier circuit of the comparator circuit, a tracking circuit coupled with a common output location of the pre-amplifier circuit to provide (e.g., source/sink) an additional current to the common output location of the pre-amplifier circuit using an alternate current path in the tracking circuit when an input common mode of the pre-amplifier circuit is beyond a saturation range, and a second circuit of the comparator circuit coupled with the pre-amplifier circuit. A scaled version of a pair of input transistors of a pre-amplifier circuit of the tracking circuit may be created using a scaling factor ('N').

20 Claims, 6 Drawing Sheets

CONSTANT OUTPUT COMMON MODE VOLTAGE OF A PRE-AMPLIFIER CIRCUIT

CLAIMS OF PRIORITY

This patent application claims priority from India Patent Application No. 1360/CHE/2008, titled "Constant Output Common Mode Voltage of A Pre-Amplifier Circuit" filed with Indian Patent Office on Jun. 4, 2008.

FIELD OF TECHNOLOGY

This disclosure relates generally to an enterprise method, a technical field of software and/or hardware technology and, in one example embodiment, to a method, apparatus and system of constant output common mode voltage of a pre-amplifier circuit.

BACKGROUND

A comparator circuit is a device which may compare two voltages (e.g., and/or currents) and which may switch its output to indicate which is larger. The comparator circuit (e.g., a high speed comparator) may use a pre-amplifier circuit (e.g., a first pre-amplifier of an input stage of the comparator circuit) to translate an input common-mode voltage of the pre-amplifier circuit to a level acceptable to stages that follow the pre-amplifier circuit in the comparator circuit. The pre-amplifier circuit may have an instable output common mode voltage when an input common mode to the pre-amplifier circuit varies over a wide range of voltages.

Sometimes, a negative feedback loop may be used. However, the negative feedback loop may require time consuming and/or expensive stability analysis. In addition, undesirable elements in a differential signal path of the pre-amplifier circuit may be introduced. Without any correction, the instable output common mode voltage may vary when the input common mode of the pre-amplifier circuit varies over the wide range of voltages. This may make a design of stages of the comparator circuit which follow the pre-amplifier circuit more difficult.

SUMMARY

A method, apparatus and system of constant output common mode voltage of a pre-amplifier circuit are disclosed. In one aspect, a system includes a first circuit, a comparator circuit coupled with an output of the first circuit, a pre-amplifier circuit of the comparator circuit, a tracking circuit coupled with a common output location of the pre-amplifier circuit to provide an additional current to the common output location of the pre-amplifier circuit using an alternate current path in the tracking circuit when an input common mode of the pre-amplifier circuit is beyond a saturation range, and a second circuit of the comparator circuit coupled with the pre-amplifier circuit.

A scaled version of a pair of input transistors of a pre-amplifier circuit of the tracking circuit may be created using a scaling factor ('N'). An effect of the input common mode of the pre-amplifier circuit may be canceled through the additional current provided to the common output location. An output common mode voltage that is stable may be achieved in the pre-amplifier circuit through the additional current provided to the common output location from the tracking circuit.

The tracking circuit may mirror a difference current in the alternate path with an alternate path transistor based on a mirroring ratio ('K'). The tracking circuit may scale the difference current in the alternate path with the alternate path transistor to create the additional current. The pre-amplifier circuit may add the additional current to the common output location through a common mode resistor ('R2') of the pre-amplifier circuit. The mirroring ratio ('K') may be defined by a formula, wherein 'R0' is a differential load resistor.

The tracking circuit may apply a nominal current path in the tracking circuit when the input common mode of the pre-amplifier circuit is in the saturation range. The tracking circuit may be created in both a p-type metal-oxide-semiconductor field effect transistor (PMOS) side and an n-type metal-oxide-semiconductor field effect transistor (NMOS) side of the pre-amplification circuit. The pre-amplifier circuit may not include a common mode resistor ('R2') associated with the common output location. The pre-amplifier circuit may have a rail to rail input.

In another aspect, a method includes creating scaled version of a pair of input transistors of a pre-amplifier circuit in a tracking circuit using a scaling factor ('N'), coupling the tracking circuit to a common output location of the pre-amplifier circuit, providing an additional current to the common output location of the pre-amplifier circuit using an alternate current path in the tracking circuit when an input common mode of the pre-amplifier circuit is beyond a saturation range, canceling an effect of the input common mode of the pre-amplifier circuit through the additional current provided to the common output location, and achieving an output common mode voltage that is stable in the pre-amplifier circuit through the additional current provided to the common output location from the tracking circuit.

The method may mirror a difference current in the alternate path with an alternate path transistor based on a mirroring ratio ('K'). Furthermore, the method may scale the difference current in the alternate path with the alternate path transistor to create the additional current. In addition, additional current may be added to the common output location through a common mode resistor ('R2') of the pre-amplifier circuit. A nominal current path may be applied in the tracking circuit when the input common mode of the pre-amplifier circuit that is not beyond the saturation range.

In yet another aspect, an integrated circuit may include a pre-amplifier circuit translate an input common mode to a level acceptable to stages that follow the pre-amplifier circuit and a tracking circuit of the pre-amplifier circuit to provide an additional current to the common output location of the pre-amplifier circuit using an alternate current path in the tracking circuit when an input common mode of the pre-amplifier circuit is beyond a saturation range.

The tracking circuit may cancel an effect of the input common mode of the pre-amplifier circuit through the additional current provided to the common output location. The pre-amplifier circuit may achieve an output common mode voltage that is stable in the pre-amplifier circuit through the additional current provided to the common output location from the tracking circuit. A nominal current path may be applied in the tracking circuit when the input common mode of the pre-amplifier circuit that is not beyond the saturation range.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Figure 1:
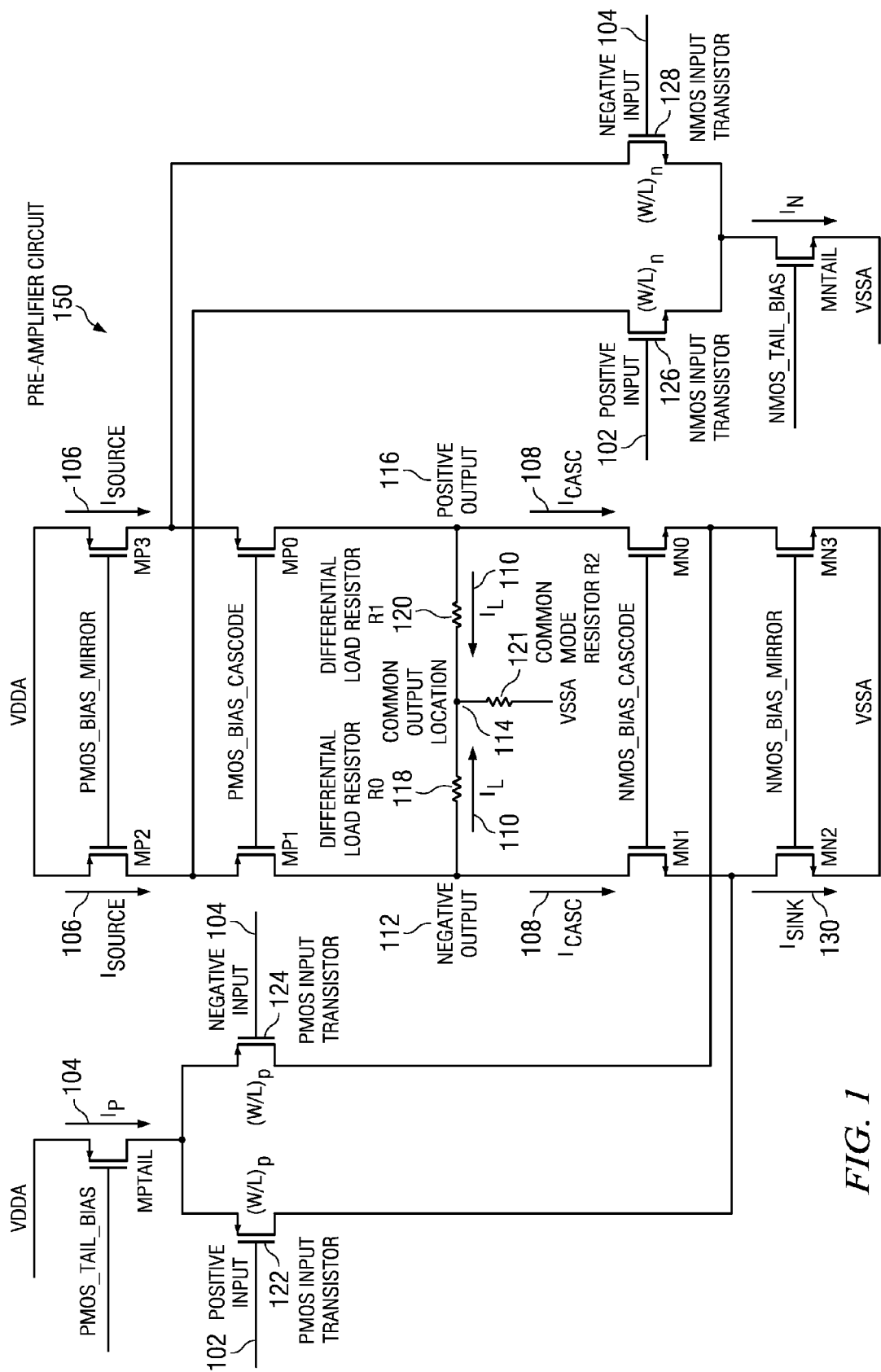
FIG. 1 is schematic view of a pre-amplifier circuit including additional resistors, according to one embodiment.

Other features of the present embodiments will be apparent from the accompanying drawings and from the detailed description that follows.

DETAILED DESCRIPTION

A method, apparatus and system of constant output common mode voltage of a pre-amplifier circuit are disclosed. Although the present embodiments have been described with reference to specific example embodiments, it will be evident that various modifications and changes may be made to these embodiments without departing from the broader spirit and scope of the various embodiments.

A system includes a first circuit (e.g., the first circuit 602 of FIG. 1), a comparator circuit (e.g., the comparator circuit 600 of FIG. 6) coupled with an output of the first circuit 602, a pre-amplifier circuit (e.g., the pre-amplifier circuit 150 of FIG. 1) of the comparator circuit 600, a tracking circuit (e.g., the tracking circuit 250 and 350 of FIG. 2 and FIG. 3) coupled with a common output location (e.g., the common output location 114 of FIG. 1) of the pre-amplifier circuit 150 to provide an additional current to the common output location of 114 the pre-amplifier circuit 150 using an alternate current path (e.g., the alternate current path 202 of FIG. 2) in the tracking circuit 250/350 when an input common mode of the pre-amplifier circuit 150 is beyond a saturation range and a second circuit (e.g., the second circuit 604 of FIG. 6) of the comparator circuit 600 coupled with the pre-amplifier circuit 150.

A method includes creating scaled version of a pair of input transistors (e.g., may be a pair of PMOS input transistors 122 and 124 or a pair of NMOS input transistors 126 and 128) of a pre-amplifier circuit (e.g., the pre-amplifier circuit 150 of FIG. 1) in a tracking circuit (e.g., the tracking circuit 250 of FIG. 2 and the tracking circuit 350 of FIG. 3) using a scaling factor ('N'), coupling the tracking circuit 250/350 to a common output location (e.g., the common output location 114 of FIG. 1) of the pre-amplifier circuit 150, providing an additional current to the common output location 114 of the pre-amplifier circuit 150 using an alternate current path (e.g., the alternate current path 202 of FIG. 2) in the tracking circuit 250/350 when an input common mode of the pre-amplifier circuit 150 is beyond a saturation range, canceling an effect of the input common mode of the pre-amplifier circuit 150 through the additional current provided to the common output location 114 and achieving an output common mode voltage that is stable in the pre-amplifier circuit 150 through the additional current provided to the common output location 114 from the tracking circuit 250/350.

An integrated circuit includes a pre-amplifier circuit (e.g., the pre-amplifier circuit 150 of FIG. 1) translate an input common mode to a level acceptable to stages that follow the pre-amplifier circuit 150, a tracking circuit (e.g., the tracking circuit 250 of FIG. 2 and the tracking circuit 350 of FIG. 3) of the pre-amplifier circuit 150 to provide an additional current to a common output location (e.g., the common output location 114 of FIG. 1) of the pre-amplifier circuit 150 using an alternate current path (e.g., the alternate current path 202 of FIG. 2) in the tracking circuit 250 when an input common mode of the pre-amplifier circuit 150 is beyond a saturation range.

FIG. 1 is schematic view of a pre-amplifier circuit including additional resistors, according to one embodiment. Particularly, FIG. 1 illustrates a positive input 102, a negative input 104, $I_{source}$ 106, $I_{casc}$ 108, IL 110, a negative output 112, a common output location 114, a positive output 116, a differential load resistor R1 118, a differential load resistor R0 120, a common mode resistor R2 121, PMOS input transistors 122 and 124, NMOS input transistors 126 and 128, and $I_{sink}$ 130, according to one embodiment.

The positive input 102 may be one of the inputs to the pre-amplifier circuit 150 that may go the PMOS input transistor 122. The negative input 104 may be another input to the pre-amplifier circuit 150 that may go the PMOS input transistor 124 (e.g., as illustrated in FIG. 1). The $I_{source}$ 106 may be the current coming through the current source (e.g., MP2) from VDDA (e.g., supply). The $I_{case}$ 108 may be a part of the current (e.g., the current coming from the drain of MP1) that has been divided at negative output 112 node. The IL 110 may be the remaining part of the current (e.g., that had been divided at negative output 112 node) that may move towards the common output location 114.

The negative output 112 may be the node where one of the outputs may be tapped (e.g., the negative output 112) to provide it as an input to the next stage of the comparator circuit 600. The common output location 114 may be the node where common output may be tapped. The common output location 114 may be the point where tracking circuits may be connected in order to compensate for the IL 110. The positive output 116 may be a node where another output may be tapped (e.g., positive output 116) to provide it as another input to the next stage of the comparator. The differential load resistor R1 118 may be a resistor that may enable drawing of output (e.g., output at differential mode that may contain data/information).

The differential load resistor R0 120 may be a resistor that may enable drawing of output (e.g., the second output). The common mode resistor R2 121 may be a resistor that may be connected at the common output location 114 node where the compensation circuit (e.g., may be the tracking circuits 250/350) can be connected to cancel the effect of the input common mode voltage during extremities that are out of range (e.g., over range in common mode voltage). The PMOS input transistors 122 and 124 may be PMOS field effect transistors (e.g., that may be used for amplification, switching purposes, etc.) that may intake the inputs (e.g., positive and negative input) for the pre-amplifier circuit 150.

The NMOS input transistors 126 and 128 may be PMOS field effect transistors (e.g., that may be used for amplification, switching purposes, etc.) that may intake the inputs (e.g., positive and negative input) for the pre-amplifier circuit 150. The $I_{sink}$ 130 may be the current at MN2 transistor that may be sum of $I_{casc}$ 108 and current coming from the drain of the PMOS input transistor 122.

In example embodiment, FIG. 1 illustrates the pre-amplifier circuit 150 that may have a pair of PMOS and NMOS input transistors to receive inputs, and the load resistors coupled with the common mode resistor R2 121 to receive outputs. The part of circuit that includes MP0, MP1, MP2, MP3, MN0, MN1, MN2, MN3 and load resistors may add/subtract current coming from the input transistors (e.g., the PMOS and NMOS input transistors). The VDDA (e.g., input voltage) is supplied to the source of the MPTAIL, MP2 and MP3 PMOS transistors. The MP2 and MP3 PMOS transistors have a common gate and may be called as PMOS_BIAS_MIRROR.

The source of the MP1 PMOS transistor is connected to the drain of the MP2 PMOS transistor, where the drain of the NMOS input transistor 128 may be connected. The source of the MP0 PMOS transistor is connected to the drain of the MP3 PMOS transistor, where the drain of the NMOS input transistor 126 may be connected. The MP1 and MP0 PMOS transistors have a common gate and may be called as PMOS_BIAS_CASCODE. The drain of the MP1 PMOS transistor is connected to the junction of the drain of the MN1 NMOS transistor and the negative output 112 terminal. The drain of the MP0 PMOS transistor is connected to the junction of the drain of the MN0 NMOS transistor and the positive output 116 terminal.

The MN2 and MN3 NMOS transistors have a common gate and may be called as NMOS_BIAS_MIRROR. The source of the MN1 NMOS transistor is connected to the drain of the MN2 NMOS transistor, where the drain of the PMOS input transistor 122 may be connected. The source of the MN0 NMOS transistor may is connected to the drain of the MN3 NMOS transistor, where the drain of the PMOS input transistor 124 may be connected. The MPTAIL PMOS transistor drain may be connected to the junction of the sources of the PMOS input transistors 122 and 124. The MPTAIL NMOS transistor drain may be connected to the junction of the sources of the NMOS input transistors 126 and 128.

In one embodiment, a system may include a first circuit (e.g., the first circuit 602 of FIG. 1), a comparator circuit (e.g., the comparator circuit 600 of FIG. 6) coupled with an output of the first circuit 602, a pre-amplifier circuit (e.g., the pre-amplifier circuit 150 of FIG. 1) of the comparator circuit 600. The system may also include a tracking circuit (e.g., the tracking circuit 250 and 350 of FIG. 2 and FIG. 3) coupled with a common output location (e.g., the common output location 114 of FIG. 1) of the pre-amplifier circuit 150 to provide an additional current to the common output location of 114 the pre-amplifier circuit 150 using an alternate current path (e.g., the alternate current path 202 of FIG. 2) in the tracking circuit 250/350 when an input common mode of the pre-amplifier circuit 150 is beyond a saturation range and a second circuit (e.g., the second circuit 604 of FIG. 6) of the comparator circuit 600 coupled with the pre-amplifier circuit 150. The pre-amplifier circuit 150 may have a rail to rail input. The pre-amplifier circuit 150 may translate an input common mode to a level acceptable to stages that follow the pre-amplifier circuit 150.

Figure 2:
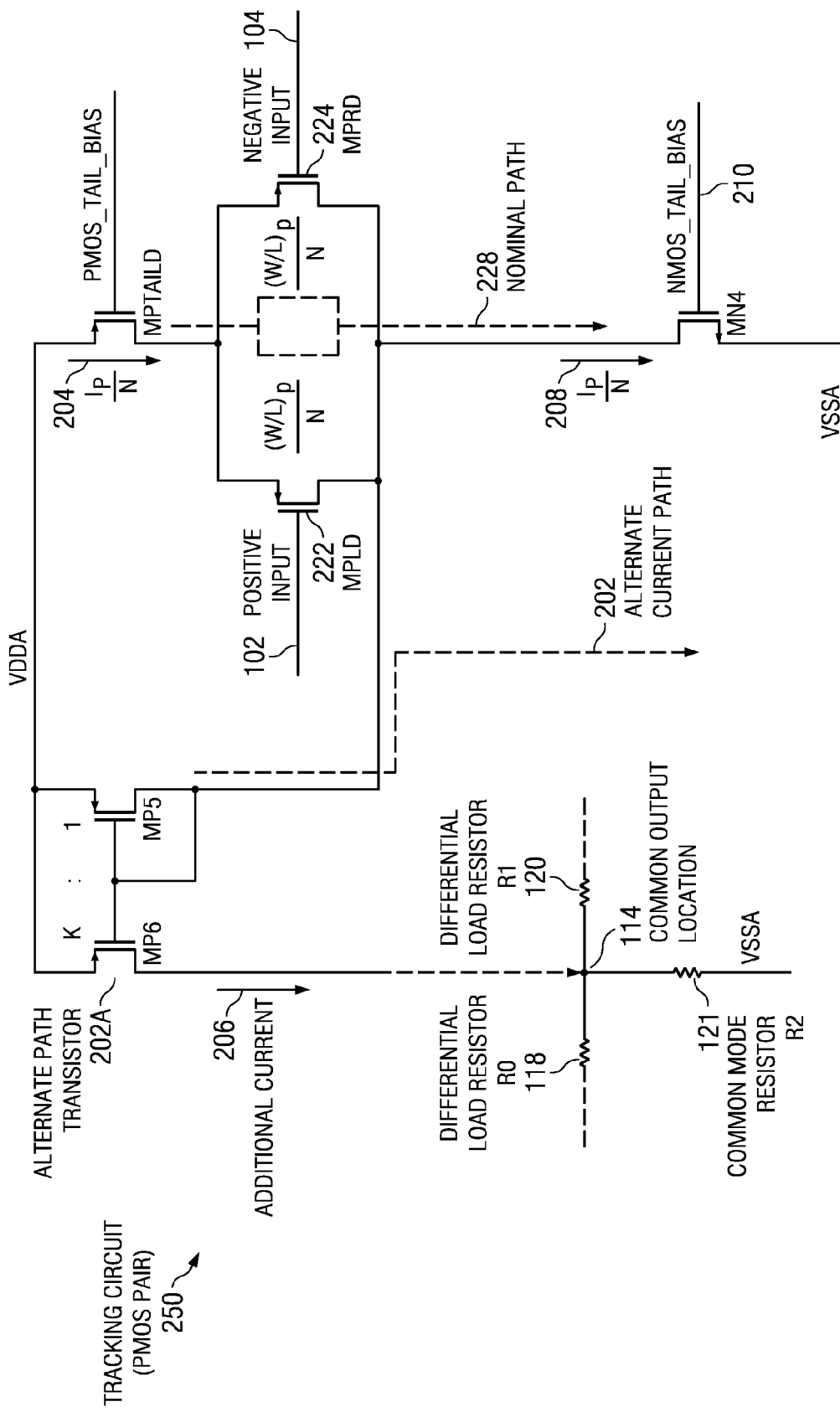
FIG. 2 is a tracking circuit that includes a pair of PMOS transistor, according to one embodiment.

FIG. 2 is a tracking circuit that includes a pair of PMOS transistor, according to one embodiment. Particularly, FIG. 2 illustrates the positive input 102, the negative input 104, the common output location 114, a differential load resistor R1 118, the differential load resistor R0 120, the common mode resistor R2 121, an alternate current path 202, an alternate path transistor 202A, $I_P/N$ 204, additional current 206, $I_P/N$ 208, NMOS_TAIL_BIAS 210, scaled PMOS input transistors MPLD 222 and MPRD 224, and a nominal path 228, according to one embodiment.

The alternate current path 202 may be the path where the additional current 206 may flow when there is fall of current (e.g., the $I_P/N$ 204) at the drain terminals of the PMOS transistor MPLD 222 and MPRD 224. The alternate path transistor 202A may be the transistor that may provide the additional current 206 based on the measure of the shortage in current at the drain terminals of PMOS transistors MPLD 222 and MPRD 224. The $I_P/N$ 204 may be the current coming through the PMOS transistor MPTAILD to the sources of the PMOS transistors MPLD 222 and MPRD 224. The additional current 206 may be the additional current 206 that may cancel the effect of the extremities of input common voltage mode.

The $I_P/N$ 208 may be the current coming from the drains of the PMOS transistors MPLD 222 and MPRD 224 that may be drawn by the NMOS transistor MN4. The NMOS_TAIL_BIAS 210 may be bias current (e.g., at the gate of the transistor) that may be required to turn on the NMOS MN4 transistor to enable the flow of the $I_P/N$ 208 through it. The scaled PMOS input transistors MPLD 222 and MPRD 224 may be the PMOS transistors which may be scaled by the factor of 'N' in reference to the PMOS input transistors 122 and 124. The nominal path 228 may be the path of the current flow when the PMOS transistor MPTAILD is operating in the saturation mode.

In example embodiment, FIG. 2 illustrates the tracking circuit 250 that may be constructed by mirroring the input circuit (e.g., the input circuit including the PMOS input transistors 122 and 124) and by scaling the circuit by a factor 'N' in reference to the PMOS input transistors 122 and 124. VDDA may be voltage supply to the PMOS MPTAILD transistor that may require PMOS_TAIL_BIAS bias current. The $I_P/N$ 204 current may be the current passing that passes through the drain terminal of the MPTAILD PMOS transistor to the source terminals of the PMOS transistors MPLD 222 and MPRD 224.

The $I_P/N$ 208 current may be extracted by the NMOS transistor MN4 that may come through the drain terminals of the PMOS transistors MPLD 222 and MPRD 224. The path of the $I_P/N$ current that comes from drain terminal of the MPTAILD, passing through the PMOS transistors MPLD 222 and MPRD 224 and reaching the drain terminal of the NMOS transistor MN4 is called the nominal path 228. The gate and the drain terminals of the PMOS transistor MP5 may be shorted to convert the transistor into a diode. The alternate path transistor 202A has a common gate with that of the PMOS transistor MP5 may provide an additional current based on the information (e.g., the exact amount of the shortage of current) by sensing the current at the drain terminals of PMOS transistors MPLD 222 and the MPRD 224.

The additional current may be sent directly to the common output location 114 after modifying (e.g., reverse scaling by the factor 'N') the additional current 206. The mirroring ratio 'K' may be used to mirror the difference current in the alternate path with an alternate path transistor 202A.

In one embodiment, the scaled version of a pair of input transistors (e.g., the pair of PMOS input transistors 122 and 124) of the pre-amplifier circuit 150 of the tracking circuit 250/350 may be created using a scaling factor ('N'). The effect of the input common mode of the pre-amplifier circuit 150 may be canceled through the additional current provided to the common output location 114. The output common mode voltage that is stable may be achieved in the pre-amplifier circuit 150 through the additional current provided to the common output location 114 from the tracking circuit 250. The tracking circuit 250 may mirror a difference current in the alternate path with an alternate path transistor (e.g., the alternate path transistor 202A of FIG. 2) based on a mirroring ratio ('K').

The tracking circuit 250 may scale the difference current in the alternate current path with the alternate path transistor 202A to create the additional current. The pre-amplifier circuit 150 may add the additional current to the common output location 114 through a common mode resistor ('R2') (e.g., the common mode resistor ('R2') 121 of FIG. 2) of the pre-amplifier circuit 150. The mirroring ratio ('K') may be defined by a formula, $$K = N \times \left(1 + \frac{R0}{2 \cdot R2}\right)$$

where 'R0' is a differential load resistor (e.g., the differential load resistor ('R0') 118 of FIG. 1).

The tracking circuit 250 may apply the nominal path 228 in the tracking circuit 250 when the input common mode of the pre-amplifier circuit 150 is in the saturation range. The tracking circuit 250 may be created in both a p-type metal-oxide-semiconductor field effect transistor (PMOS) side and an n-type metal-oxide-semiconductor field effect transistor (NMOS) side of the pre-amplifier circuit 150. The pre-amplifier circuit 150 may not include the common mode resistor ('R2') (e.g., the common mode resistor ('R2') 121 of FIG. 2) associated with the common output location.

The method includes creating scaled version of a pair of input transistors (e.g., may be a pair of PMOS input transistors 122 and 124 or a pair of NMOS input transistors 126 and 128) of the pre-amplifier circuit 150 in the tracking circuit 250 using a scaling factor ('N'). The tracking circuit 250/350 may be coupled to a common output location (e.g., the common output location 114 of FIG. 1) of the pre-amplifier circuit 150. The additional current 206 may be provided to the common output location 114 of the pre-amplifier circuit 150 using an alternate current path (e.g., the alternate current path 202 of FIG. 2) in the tracking circuit 250/350 when an input common mode of the pre-amplifier circuit 150 is beyond a saturation range.

The effect of the input common mode may be canceled of the pre-amplifier circuit 150 through the additional current 206 provided to the common output location 114. The output common mode voltage that is stable in the pre-amplifier circuit 150 may be achieved through the additional current 206 provided to the common output location 114 from the tracking circuit 250/350.

The difference current may be mirrored in the alternate path with the alternate path transistor 202A based on a mirroring ratio ('K'). The difference current may be scaled in the alternate current path 202 with the alternate path transistor 202A to create the additional current 206. The additional current 206 may be added to the common output location through a common mode resistor ('R2') (e.g., the common mode resistor ('R2') 121 of FIG. 2) of the pre-amplifier circuit 150. The nominal path 228 may be applied in the tracking circuit 250/350 when the input common mode of the pre-amplifier circuit 150 that is not beyond the saturation range.

The tracking circuit 250/350 may be created in both a p-type metal-oxide-semiconductor field effect transistor (PMOS) side and an n-type metal-oxide-semiconductor field effect transistor (NMOS) side of the pre-amplifier circuit. The pre-amplifier circuit 150 may not include a common mode resistor ('R2') (e.g., the common mode resistor ('R2') 121 of FIG. 2) associated with the common output location. The tracking circuit (e.g., the tracking circuit 250 of FIG. 2 and the tracking circuit 350 of FIG. 3) of the pre-amplifier circuit 150 may provide an additional current to a common output location (e.g., the common output location 114 of FIG. 1) of the pre-amplifier circuit 150 using an alternate current path (e.g., the alternate current path 202 of FIG. 2) in the tracking circuit 250/350 when an input common mode of the pre-amplifier circuit 150 is beyond a saturation range.

The tracking circuit 250/350 may cancel an effect of the input common mode of the pre-amplifier circuit 150 through the additional current 206 provided to the common output location 114. The pre-amplifier circuit 150 may achieve an output common mode voltage that is stable in the pre-amplifier circuit 150 through the additional current provided to the common output location 114 from the tracking circuit 250/350.

Figure 3:
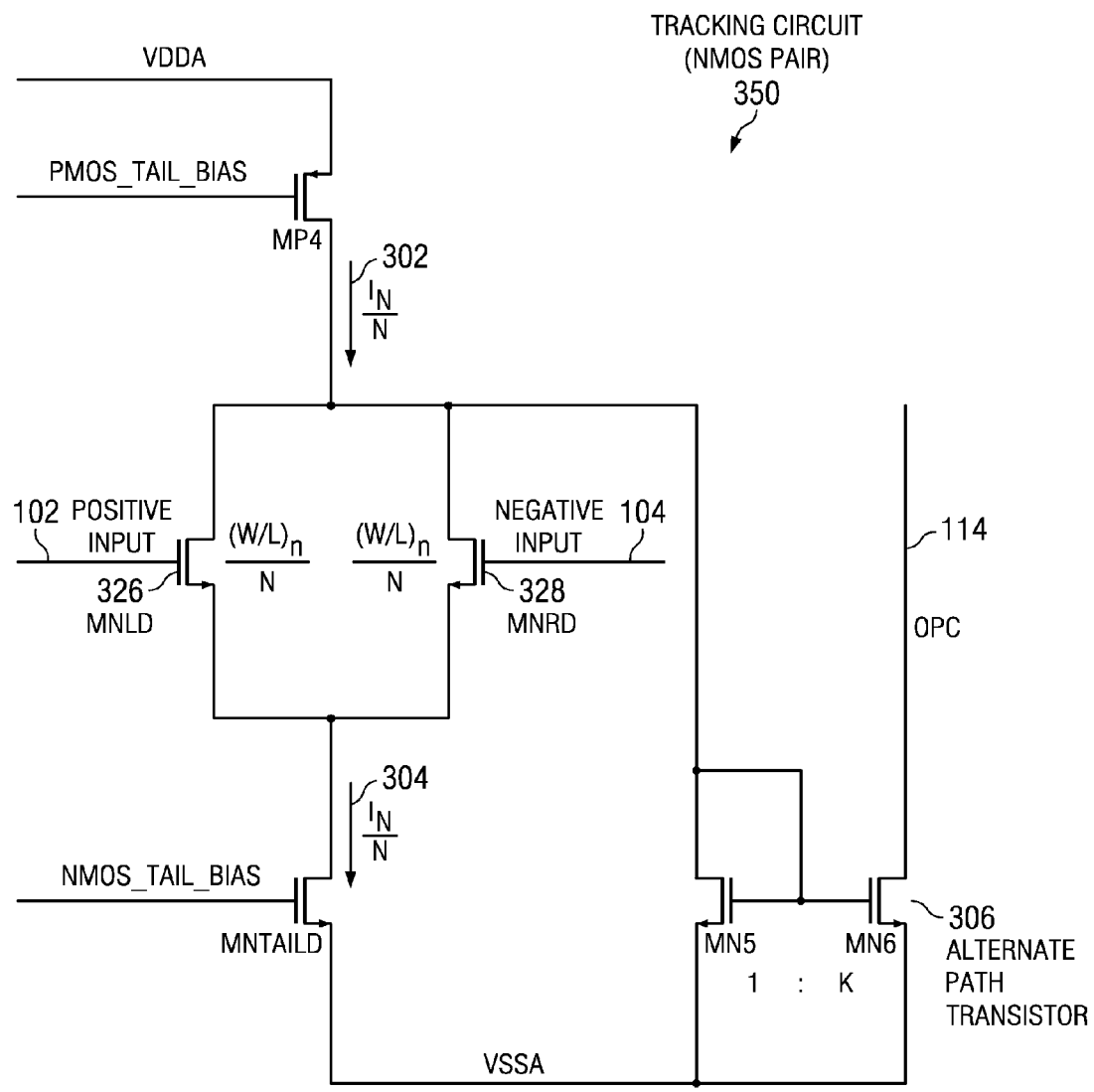
FIG. 3 is a tracking circuit that includes a pair of NMOS transistor, according to one embodiment.

FIG. 3 is a tracking circuit that includes a pair of NMOS transistor, according to one embodiment. Particularly, FIG. 3 illustrates the positive input 102, the negative input 104, $I_N/N$ 302, $I_N/N$ 304, an alternate path transistor MN6 306 and scaled NMOS transistors MNLD 326 and MNRD 328, according to one embodiment.

The $I_N/N$ 302 may be the current from the PMOS transistor MP4 to the drain terminals of the NMOS transistors MNLD 326 and MNRD 328. The $I_N/N$ 304 may be the current coming from the source terminals of the NMOS transistors MNLD 326 and MNRD 328 that may be drawn by the NMOS transistor MNTAILD. The alternate path transistor MN6 306 may be the transistor that may provide additional current based on the measure of the shortage in current at the drain terminals of NMOS transistors MNLD 326 and MNRD 328. The scaled NMOS transistors MNLD 326 and MNRD 328 may be the transistors (e.g., that may be used to amplify, switch, etc.) that may be scaled by the factor of 'N' in reference to the NMOS input transistors 126 and 128.

In example embodiment, FIG. 3 illustrates the tracking circuit 350 that may be made by the pair of scaled NMOS circuits in reference to the NMOS input transistors 126 and 128. The NMOS MNTAILD transistor may have supply from VSSA through the source terminal. The drain terminal may be connected to the source terminals of the scaled NMOS transistors MNLD 326 and MNRD 328. The drain terminals of the scaled NMOS transistors MNLD 326 and MNRD 328 are connected to the drain terminal of the PMOS transistor MP4. The source of the PMOS transistor may be connected to the VDDA (e.g., the source terminal). The alternate path transistor MN6 306 source may be connected to the VSSA. The gate of the NMOS transistors MN5 and MN6 are connected to each other. The gate and the drain of the NMOS transistor may be shorted.

Figure 4:
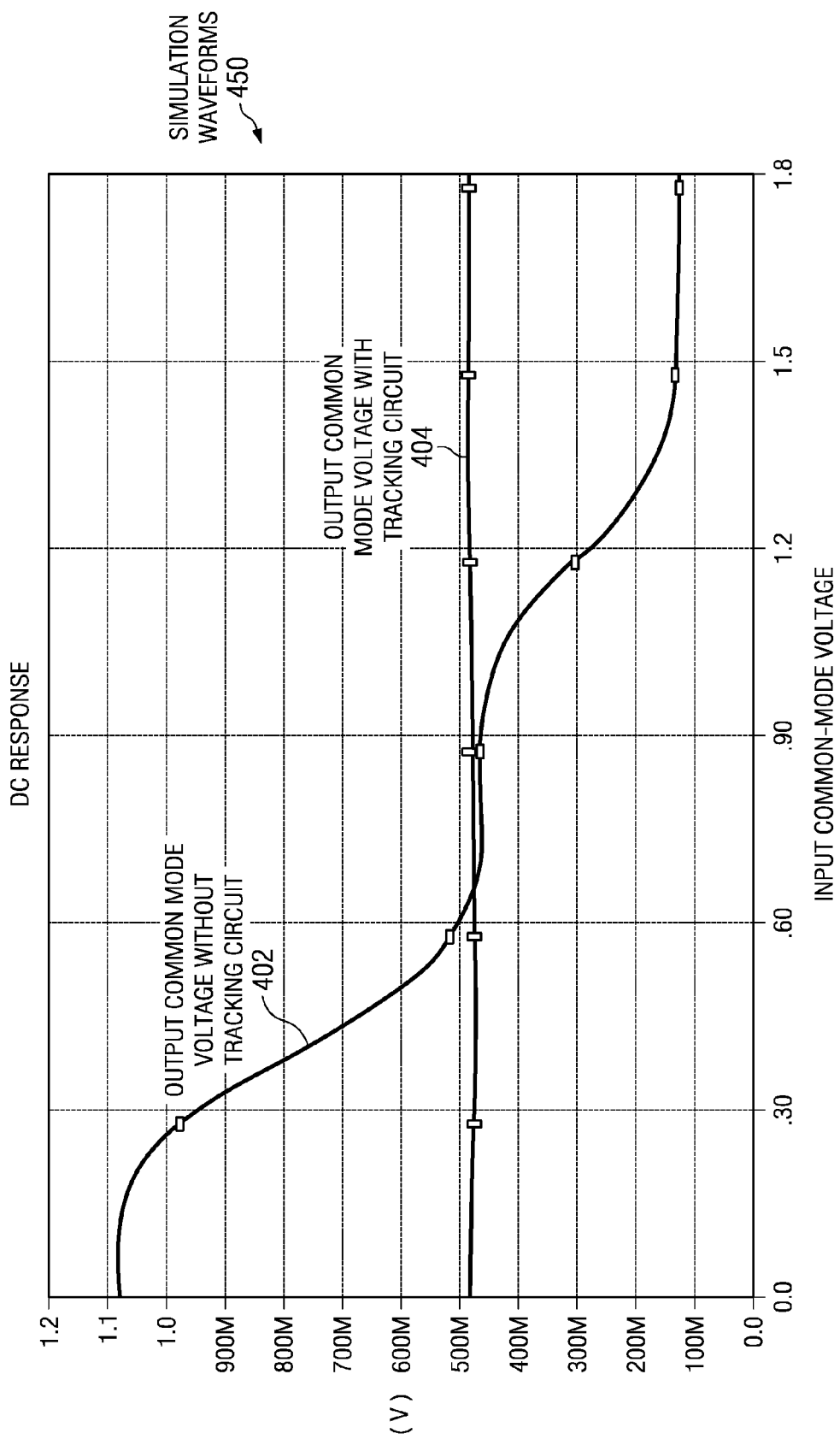
FIG. 4 is a graphical view illustrating simulation waveforms of a DC response of output common mode voltage with and without tracking circuit, according to one embodiment.

FIG. 4 is a graphical view illustrating simulation waveforms of a DC response of output common mode voltage with and without tracking circuit, according to one embodiment. Particularly, FIG. 4 illustrates an output common mode voltage without tracking circuit 402, and an output common mode voltage with tracking circuit 404, according to one embodiment.

The output common mode voltage without tracking circuit 402 may illustrate the DC sweep (e.g., waveform) of the input common mode when the tracking circuit to the pre-amplifier circuit 150 is absent. The output common mode voltage with tracking circuit 404 may be the DC sweep (e.g., waveform) of the output common mode when the tracking circuit to the pre-amplifier circuit 150 is attached.

In example embodiment, FIG. 4 illustrates the simulation waveforms 450 comparing the behavior of the pre-amplifier circuit 150 in form of waveforms of the output common mode voltage when connected to a tracking circuit and when not connected to the tracking circuit. It is very clear that when the pre-amplifier circuit is connected with the tracking circuit 250/350 the waveform is stable.

Figure 5:
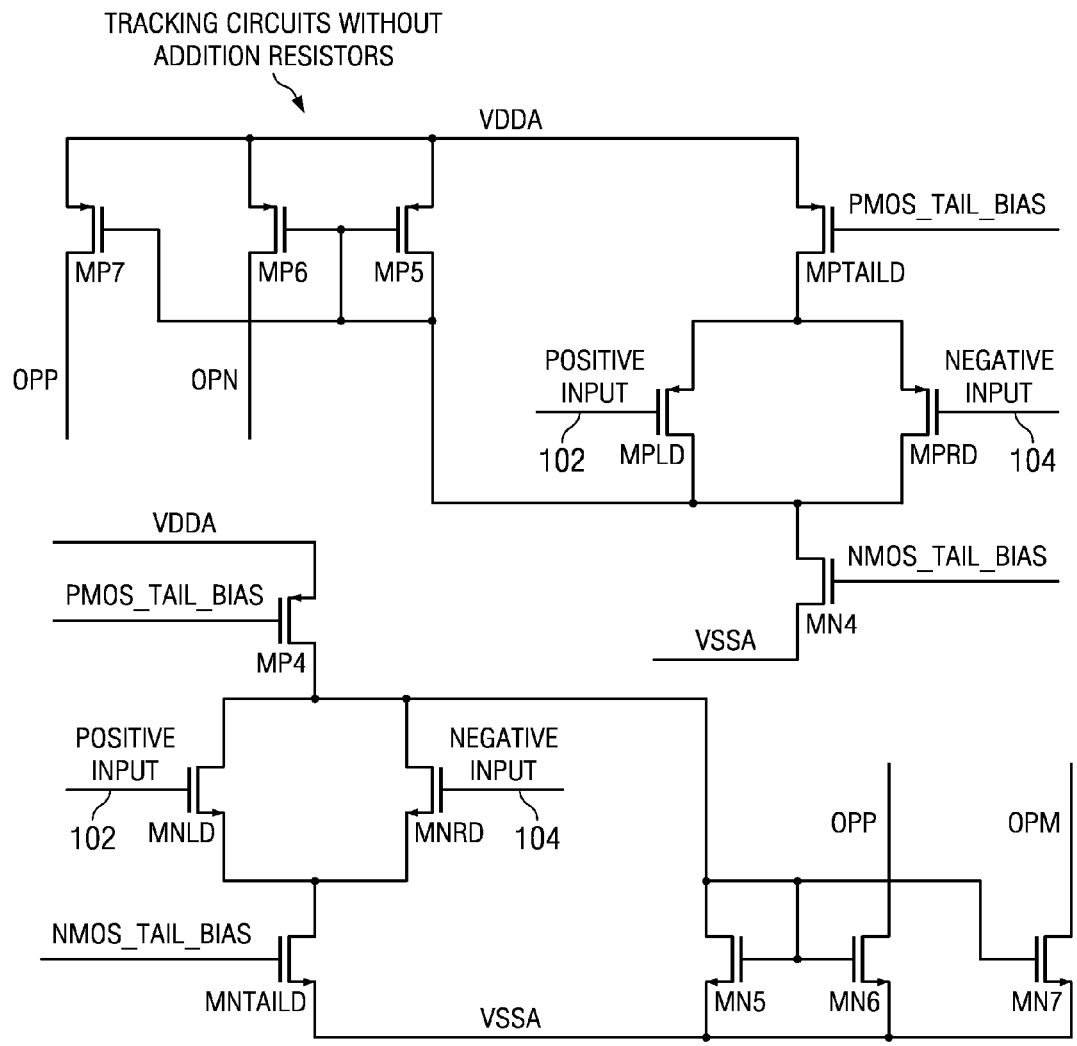
FIG. 5 illustrates schematic view of the pre-amplifier circuits with common mode resistor absent, according to one embodiment.

FIG. 5 illustrates schematic view of the pre-amplifier circuit with common mode resistor absent, according to one embodiment. Particularly, FIG. 5 illustrates the pre-amplifier circuit that may be used when common mode resistors are absent.

In example embodiment, FIG. 5 illustrates the pre-amplifier circuit that may be used when the common mode resistor R2 121 is absent. These circuits may be attached directly at addition/subtraction nodes. The addition/subtraction nodes may be the nodes where these pre-amplifier circuits can be attached in order to cancel the effects of extremities of the output mode voltage. The addition/subtraction nodes may be present at the junction between the PMOS transistors MP0, MP1, MP2, and MP3 (e.g., one point at the junctions of the drain of the MP2 and the source of MP1, another point at the junction of the drain of the MP3 and the source of MP0) and between the NMOS transistors MN0, MN1, MN2, and MN3 (e.g., one point at the junctions of the drain of the MN2 and the source of MN1, another point at the junction of the drain of the MN3 and the source of MN0).

Figure 6:
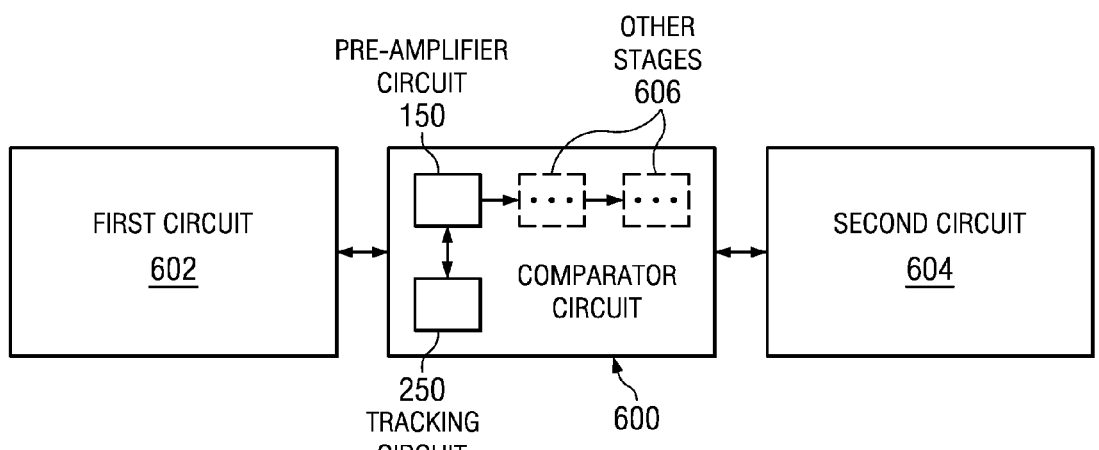
FIG. 6 is a system view illustrating comparator circuit in between first circuit and second circuit, according to one embodiment.

FIG. 6 is a system view illustrating comparator circuit in between first circuit and second circuit, according to one embodiment. Particularly, FIG. 6 illustrates the tracking circuits 250 and 350, a comparator circuit 600, a first circuit 602, a second circuit 604, and other states 606, according to one embodiment.

The comparator circuit 600 may be a circuit that may take in two inputs (e.g., the input and the reference input) and may give out an output (e.g., based on one of the input which may be taken as reference). The first circuit 602 may be a circuit (e.g., RF circuit) that may provide an input to the comparator. The second circuit 604 may be a digital circuit (e.g., may be modem) that may require comparator (e.g., as an interface) for getting the information. The other states 606 may be the consecutive stages after first stage of the pre-amplifier circuit 150.

In example embodiment, FIG. 6 illustrates the system view where the comparator circuit may act as an interface to the first circuit 602 and the second circuit 604. The comparator circuit may include several stages pre-amplifier circuits along with the tracking circuits.

Figure 7A:
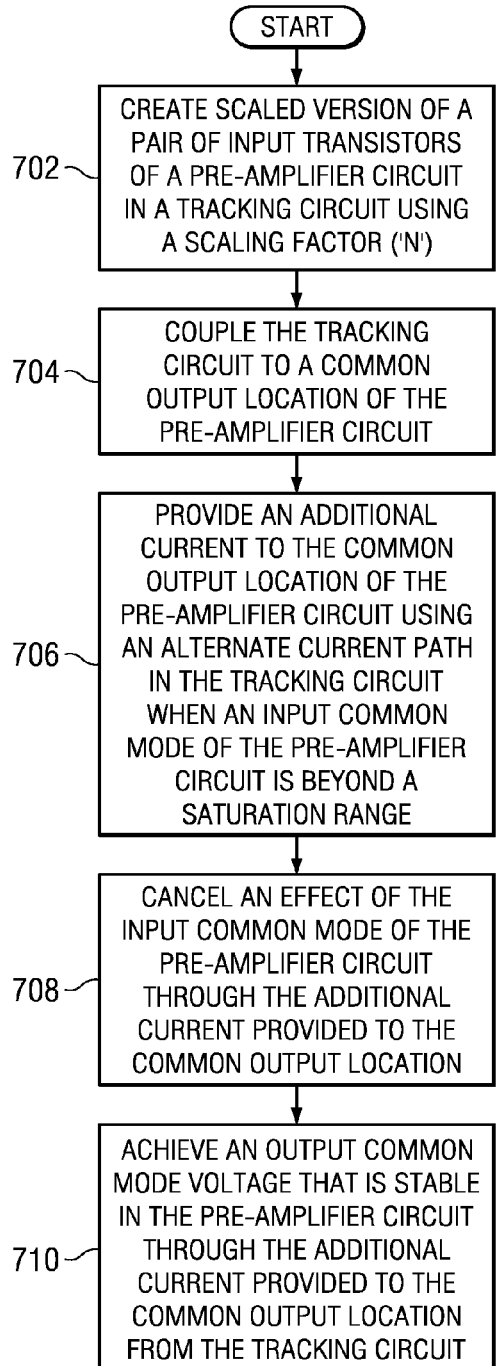
FIGS. 7A & 7B are a flow diagram of creating a scaled version of a pair of input transistors of a pre-amplifier circuit 150 in a tracking circuit 250 using a scaling factor ('N'), according to one embodiment.

FIG. 7A is a flow diagram of creating scaled version of a pair of input transistors (e.g., may be the PMOS input transistors 122 and 124 or the NMOS input transistors 126 and 128) of a pre-amplifier circuit 150 in a tracking circuit 250 using a scaling factor ('N'), according to one embodiment. In operation 702, scaled version of a pair of input transistors of a pre-amplifier circuit (e.g., the pre-amplifier circuit 150 of FIG. 1) in a tracking circuit (e.g., the tracking circuit 250 of FIG. 2 and the tracking circuit 350 of FIG. 3) may be created using a scaling factor ('N'). In operation 704, the tracking circuit 250/350 may be coupled to a common output location (e.g., the common output location 114 of FIG. 1) of the pre-amplifier circuit 150.

In operation 706, an additional current (e.g., the additional current 206 of FIG. 2) may be provided to the common output location 114 of the pre-amplifier circuit 150 using an alternate current path (e.g., the alternate current path 202 of FIG. 2) in the tracking circuit 250/350 when an input common mode of the pre-amplifier circuit 150 is beyond a saturation range. In operation 708, an effect of the input common mode of the pre-amplifier circuit 150 may be canceled through the additional current 206 provided to the common output location 114. In operation 710, an output common mode voltage that is stable in the pre-amplifier circuit 150 may be achieved through the additional current 206 provided to the common output location from the tracking circuit 250/350.

Figure 7B:
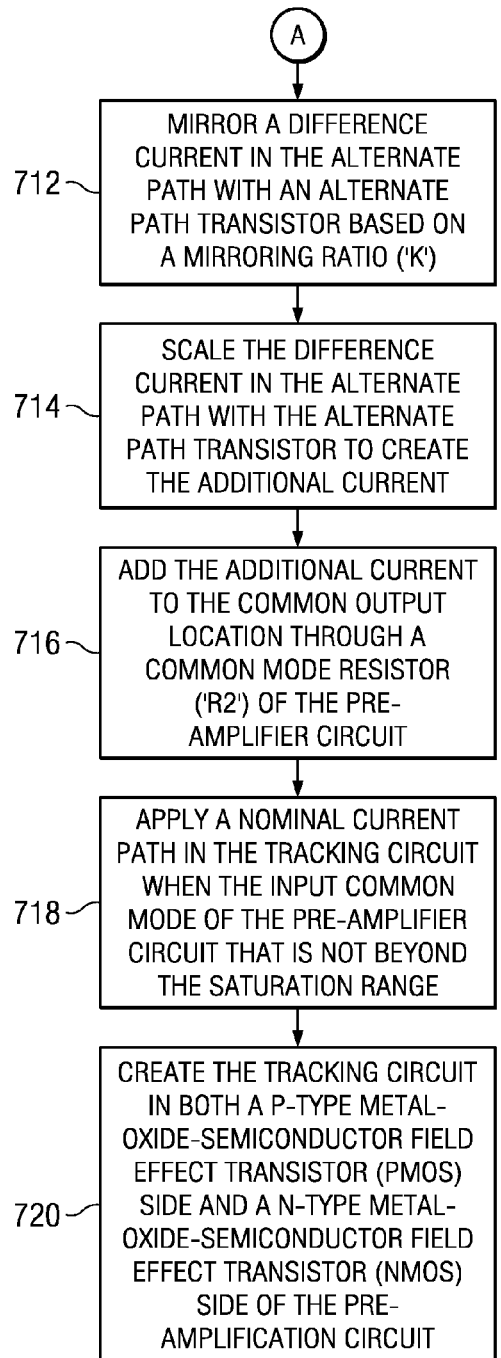

FIG. 7B is a continuation of FIG. 7A illustrating additional processes, according to one embodiment. In operation 712, a difference current in the alternate current path 202 may be mirrored with an alternate path transistor (e.g., the alternate path transistor 202A of FIG. 2) based on a mirroring ratio ('K'). In operation 714, the difference current in the alternate path may be scaled with the alternate path transistor 202A to create the additional current 206. In operation 716, the additional current 206 may be added to the common output location 114 through a common mode resistor ('R2') (e.g., the common mode resistor ('R2') 121 of FIG. 2) of the pre-amplifier circuit 150.

The mirroring ratio ('K') may be defined by a formula, $$K = N \times \left(1 + \frac{R0}{2 \cdot R2}\right)$$

where 'R0' is a differential load resistor (e.g., the differential load resistor ('R1') 120 of FIG. 2). In operation 718, a nominal current path (e.g., the nominal path 228 of FIG. 2) in the tracking circuit 250/350 may be applied when the input common mode of the pre-amplifier circuit 150 that is not beyond the saturation range. In operation 720, the tracking circuit 250/350 may be created in both a p-type metal-oxide-semiconductor field effect transistor (PMOS) side and an n-type metal-oxide-semiconductor field effect transistor (NMOS) side of the pre-amplifier circuit 150. The pre-amplifier circuit 150 does not include the common mode resistor ('R2') 121 associated with the common output location 114. The pre-amplifier circuit 150 may have a rail to rail input.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A system comprising:
   a first circuit;
   a comparator circuit coupled with an output of the first circuit;
   a pre-amplifier circuit of the comparator circuit;
   a tracking circuit coupled with a common output location of the pre-amplifier circuit to provide an additional current to the common output location of the pre-amplifier circuit using an alternate current path in the tracking circuit when an input common mode of the pre-amplifier circuit is beyond a saturation range; and
   a second circuit of the comparator circuit coupled with the pre-amplifier circuit.

2. The system of claim 1 wherein a scaled version of a pair of input transistors of the pre-amplifier circuit of the tracking circuit are created using a scaling factor ('N').

3. The system of claim 2:
   wherein an effect of the input common mode of the pre-amplifier circuit is canceled through the additional current provided to the common output location, and
   wherein an output common mode voltage that is stable is achieved in the pre-amplifier circuit through the additional current provided to the common output location from the tracking circuit.

4. The system of claim 3:
   wherein the tracking circuit to mirror a difference current in the alternate path with an alternate path transistor based on a mirroring ratio ('K'),
   wherein the tracking circuit to scale the difference current in the alternate current path with the alternate path transistor to create the additional current, and
   wherein the pre-amplifier circuit to add the additional current to the common output location through a common mode resistor ('R2') of the pre-amplifier circuit.

5. The system of claim 4 wherein the mirroring ratio ('K') is defined by a formula, wherein 'R0' is a differential load resistor and wherein:

$$K = N \times \left(1 + \frac{R0}{2 \cdot R2}\right).$$

6. The system of claim 5 wherein the tracking circuit to apply a nominal current path in the tracking circuit when the input common mode of the pre-amplifier circuit is in the saturation range.

7. The system of claim 6 wherein the tracking circuit is created in both a p-type metal-oxide-semiconductor field effect transistor (PMOS) side and a n-type metal-oxide-semiconductor field effect transistor (NMOS) side of the pre-amplification circuit.

8. The system of claim 7 wherein the pre-amplifier circuit does not include the common mode resistor ('R2') associated with the common output location.

9. The system of claim 8 wherein the pre-amplifier circuit has a rail to rail input.

10. A method comprising:
    creating scaled version of a pair of input transistors of a pre-amplifier circuit in a tracking circuit using a scaling factor ('N');
    coupling the tracking circuit to a common output location of the pre-amplifier circuit;
    providing an additional current to the common output location of the pre-amplifier circuit using an alternate current path in the tracking circuit when an input common mode of the pre-amplifier circuit is beyond a saturation range;
    canceling an effect of the input common mode of the pre-amplifier circuit through the additional current provided to the common output location; and
    achieving an output common mode voltage that is stable in the pre-amplifier circuit through the additional current provided to the common output location from the tracking circuit.

11. The method of claim 10 further comprising:
    mirroring a difference current in the alternate path with an alternate path transistor based on a mirroring ratio ('K');
    scaling the difference current in the alternate path with the alternate path transistor to create the additional current; and
    adding the additional current to the common output location through a common mode resistor ('R2') of the pre-amplifier circuit.

12. The method of claim 11 wherein the mirroring ratio ('K') is defined by a formula, wherein 'R0' is a differential load resistor and wherein:

$$K = N \times \left(1 + \frac{R0}{2 \cdot R2}\right).$$

13. The method of claim 10 further comprising applying a nominal current path in the tracking circuit when the input common mode of the pre-amplifier circuit that is not beyond the saturation range.

14. The method of claim 10 further comprising creating the tracking circuit in both a p-type metal-oxide-semiconductor field effect transistor (PMOS) side and a n-type metal-oxide-semiconductor field effect transistor (NMOS) side of the pre-amplification circuit.

15. The method of claim 10 wherein the pre-amplifier circuit does not include a common mode resistor ('R2') associated with the common output location.

16. The method of claim 10 wherein the pre-amplifier circuit has a rail to rail input.

17. An integrated circuit, comprising:
    a pre-amplifier circuit translate an input common mode to a level acceptable to stages that follow the pre-amplifier circuit; and
    a tracking circuit of the pre-amplifier circuit to provide an additional current to a common output location of the pre-amplifier circuit using an alternate current path in the tracking circuit when the input common mode of the pre-amplifier circuit is beyond a saturation range.

18. The integrated circuit of claim 17 wherein the tracking circuit to cancel an effect of the input common mode of the pre-amplifier circuit through the additional current provided to the common output location.

19. The integrated circuit of claim 18 wherein the pre-amplifier circuit to achieve an output common mode voltage that is stable in the pre-amplifier circuit through the additional current provided to the common output location from the tracking circuit.

20. The integrated circuit of claim 17 wherein the tracking circuit applies a nominal current path when the input common mode of the pre-amplifier circuit that is not beyond the saturation range.

* * * * *